(12) United States Patent
Wich

(10) Patent No.: US 6,963,188 B2
(45) Date of Patent: Nov. 8, 2005

(54) ON-CHIP POWER SUPPLY INTERFACE WITH LOAD-INDEPENDENT CURRENT DEMAND

(75) Inventor: Mathew T. Wich, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 17 days.

(21) Appl. No.: 10/818,865

(22) Filed: Apr. 6, 2004

(65) Prior Publication Data

US 2005/0218872 A1    Oct. 6, 2005

(51) Int. Cl.[7] .............................. G05F 1/40; G05F 3/16
(52) U.S. Cl. ..................................... 323/268; 323/315
(58) Field of Search ............................... 323/265, 268, 323/270, 271, 273, 275, 277, 312, 315; 363/147; 327/535, 538, 540

(56) References Cited

U.S. PATENT DOCUMENTS

| | | | |
|---|---|---|---|
| 4,769,589 A | 9/1988 | Rosenthal | 323/313 |
| 4,879,661 A * | 11/1989 | Olsen | 702/117 |
| 5,177,430 A | 1/1993 | Mohel | 323/284 |
| 5,202,624 A * | 4/1993 | Gheewala et al. | 324/754 |
| 5,877,617 A | 3/1999 | Ueda | 323/316 |
| 5,973,521 A * | 10/1999 | Kim et al. | 327/112 |
| 6,483,766 B2 * | 11/2002 | Lee | 365/230.06 |
| 2003/0076078 A1 | 4/2003 | Balakrishnan et al. | 323/284 |

* cited by examiner

Primary Examiner—Matthew V. Nguyen
(74) Attorney, Agent, or Firm—Schneck & Schneck; Thomas Schneck; Mark Protsik

(57) ABSTRACT

An on-chip interface circuit located between the chip's power supply pin and its internal circuitry senses the current load of the internal circuitry and provides a supplemental current sink so that total current demand seen at the power supply pin is substantially constant despite the internal circuitry's variable load. Sensing of the internal load is done by a sensor stage with two parallel branches, each branch having a resistor, a sense transistor, and a current mirror device, which together produce a voltage drop as a control voltage output which relates the internal load to a constant reference current. The supplemental current sink is in the form of a transistor operating below saturation in its linear region and whose gate is coupled to receive the control voltage output of the sensor stage.

12 Claims, 2 Drawing Sheets

Fig._1

ON-CHIP POWER SUPPLY INTERFACE WITH LOAD-INDEPENDENT CURRENT DEMAND

TECHNICAL FIELD

The present invention relates to interface circuitry connecting an integrated circuit's power supply pin(s) to some of its internal circuitry, and in particular relates to interface circuitry specially adapted for reducing supply current variations at the power supply pin(s) for secure integrated circuits that require immunity to differential power analysis attacks.

BACKGROUND ART

Most integrated circuits draw varying amounts of current from their power supplies, depending on operating conditions. For example, current supplied to a combined block of programming-mode bitline drivers for an embedded flash memory will vary depending upon the number of bits being programmed at any time. In most integrated circuits this is advantageous, since only as much current is drawn from the power supply as is needed, thereby minimizing power consumption.

However, the supply current variation may be problematic when data on a chip must be secured. Secure products contain confidential and encrypted internal data, including keys, which must not be revealed to unauthorized parties. Differential power analysis (DPA) is a technique in which a chip's supply current is monitored externally for data-dependent variations that may indirectly reveal the internal data within the chip. In order to provide a high degree of immunity against DPA attacks, it is desired that current variations at the power supply pin or pins be made substantially independent of the data-dependent current demand or load within the chip. If possible, this should be accomplished without increasing power consumption more than necessary.

DISCLOSURE OF THE INVENTION

The present invention is an interface circuit, situated between a power supply pin at the interface input and a secure data circuit coupled to the interface output, and this interface's method of operation, which provides a controlled supplemental load or current sink such that the overall current demand seen at the power supply pin is substantially constant despite data-dependent variations in load by the secure data circuit.

The interface circuitry comprises a reference current stage, a voltage sensor stage and a supplemental load stage controlled by the voltage sensor stage. The reference current stage establishes an operating current reference for use by the voltage sensor stage. The voltage sensor stage comprises two branches, each having a resistor, a sense transistor, and a current mirror device, coupled between the interface circuit's input and ground. The current mirror devices in each branch have their gates coupled to a matching device in the reference current stage, so that current through each branch mirrors the reference current. The sense transistors and resistors in the two branches, configured as a differential amplifier, convert any change in current load at the interface output into a sense voltage that controls a supplemental load transistor. In essence, the current load by the internal circuitry is sensed as a voltage drop across the output impedance of the resistor in the second branch, which is referenced to a corresponding voltage drop across a proportional resistor in the first branch for a constant reference current.

The supplemental load transistor, whose gate is coupled to receive the control voltage from the sensor stage, operates below saturation in its linear region to sink extra current that is not needed by the internal circuitry, so that total current demand by both the internal circuitry and supplemental load transistor are substantially constant up to a limit defined by the maximum conduction at saturation by the supplemental load transistor.

BEST MODE OF CARRYING OUT THE INVENTION

Figure 1:
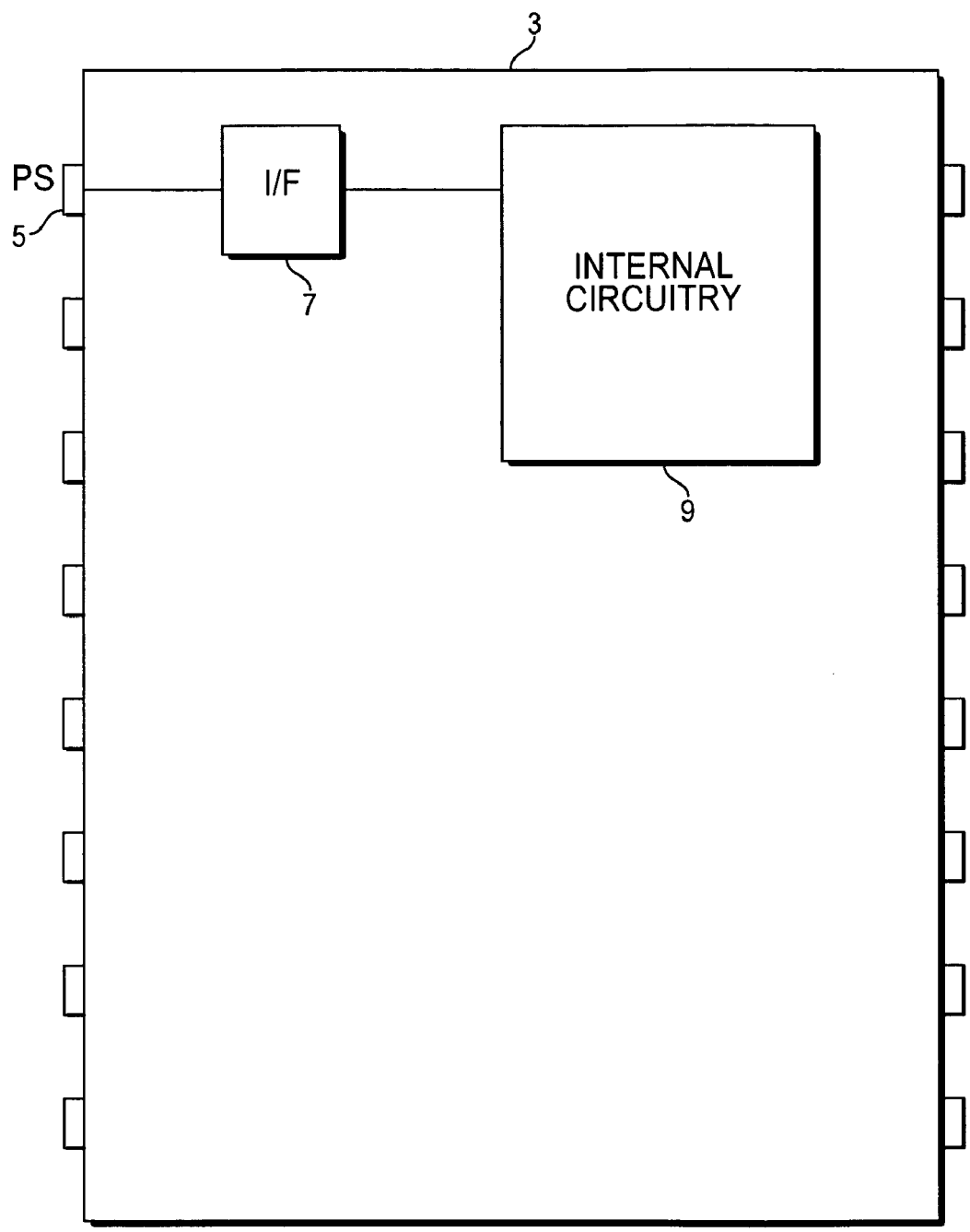
FIG. 1 is a block diagram of an integrated circuit having an interface circuit in accord with the present invention.

With reference to FIG. 1, an integrated circuit 3 makes use of interface circuit 7 in accord with the present invention. The interface circuit 7 is located between a power supply (PS) pin 5 of the integrated circuit and internal circuitry 9. The internal circuitry 9 is typically characterized by a variable current load which may depend upon operating conditions, such as internal data being operated upon by the internal circuitry 9. The internal circuitry 9 might comprise, for example, embedded memory. Data-dependent variations in current load might then come from operations accessing that memory for reading or programming. In secure devices, load variations should not be apparent at the power supply pin 5. The interface circuit 7 of the present invention ensures that current drawn by the integrated circuit through the power supply pin 5 is substantially constant notwithstanding any load variations of the internal circuitry 9.

Figure 2:
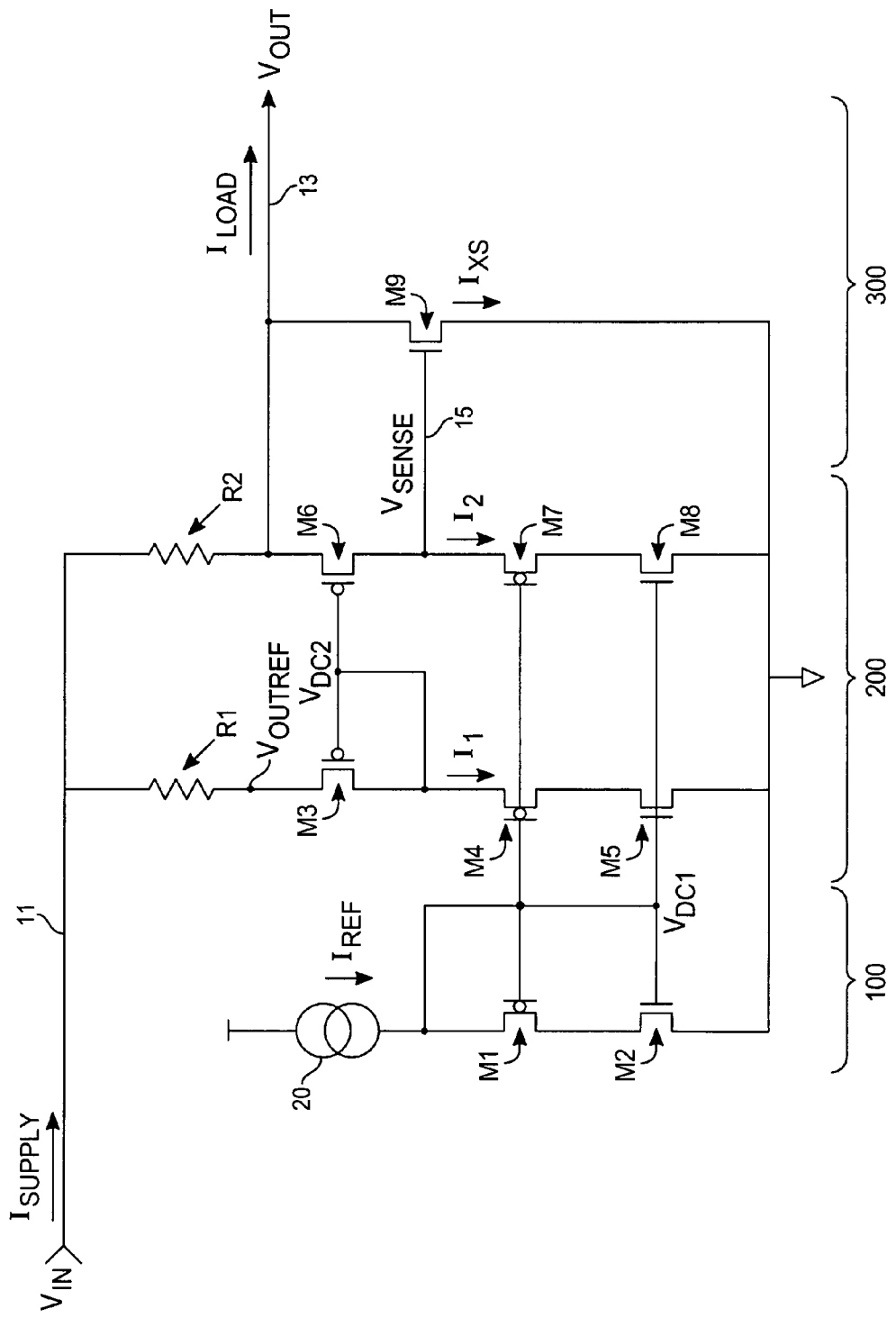
FIG. 2 is a schematic circuit diagram of an exemplary power-supply interface circuit of the present invention with an input coupled to a power supply pin and an output coupled to the rest of the on-chip circuitry with which it is integrated.

With reference to FIG. 2, an exemplary embodiment of the interface circuit in accord with the present invention is shown. An input line 11 of the interface circuit is coupled to a power supply line at an input voltage $V_{IN}$ and draws a supply current $I_{SUPPLY}$ that is intended to be substantially constant, typically not more than about 1 mA. The interface circuit provides a supply voltage $V_{OUT}$ on an output line 13 that is coupled to the rest of the on-chip circuitry, which could be a secure data circuit with embedded internal data that is intended to remain confidential. The on-chip circuitry may draw varying amounts of current $I_{LOAD}$ from the line 13, depending on operating conditions. If the variable current load $I_{LOAD}$ is, in any way, data dependent, then it is important that this load variation not be seen at the power supply pin where it might be analyzed to reveal information about the internal confidential data. The interface circuit has three main sections or stages 100, 200 and 300.

A reference current stage 100 includes a constant current source 20 providing an operating current reference $I_{REF}$ and a pair of current mirror devices M1 and M2 used to accept the reference current $I_{REF}$. Any constant current source 20 known and used in integrated circuits may be used here. It may be coupled to the same or a different power supply pin and draws constant current therefrom, typically on the order of 10 µA. The current mirror devices M1 and M2 are connected with their conduction path in series between the current source 20 and ground, and with the gates of both devices M1 and M2 coupled to the current source 20 and to the drain of device M1.

A voltage sensor stage 200 includes a left branch with a first resistor R1 and transistors M3, M4, and M5, coupled in series between the interface's input line 11 and ground, and carrying a first current $I_1$. The voltage sensor stage 200 also includes a right branch with a second resistor R2 and transistors M6, M7, and M8 coupled in series between the interface's input line 11 and ground, and carrying a second current $I_2$ between M6 and ground. Typical impedance ratios $R_1/R_2$ for the resistors R1 and R2 may range between 10 and about 100. Low output impedance $R_2$ is desired to minimize the voltage drop between the interface's input 11 and output 13. Sense transistors M3 and M6 are both p-channel devices with both their gates coupled to the drain of transistor M3 in the first branch between devices M3 and M4. The gates of n-channel transistors M1, M2, M4, M5, M7, and M8 are all tied together. The transistors M1, M4, and M7 have a lower threshold voltage than the corresponding transistors M2, M5, and M8. (Transistors M1, M4, and M7 are optional, but provide some second-order improvement in the result.) The currents $I_1$ and $I_2$ through the transistors M4, M5, M7, and M8 mirror the reference current $I_{REF}$. The voltage sensor stage 200 couples between the resistor R2 and transistor M6 of its second branch to the interface's output line 13. The voltage sensor stage 200 creates a sense voltage $V_{SENSE}$ at a stage output 15 located between the transistors M6 and M7. As will be described in detail, whenever the load current $I_{LOAD}$ being drawn by the internal circuitry is relatively small, the sense voltage $V_{SENSE}$ produced by stage 200 will be at a relatively higher potential, and whenever the load current is relatively large, the sense voltage will be a relatively lower potential.

The third stage 300 of the interface is a supplemental load that is controlled by the voltage sensor stage 200. This third stage 300 comprises an n-channel transistor M9 between the interface output 13 and ground, with its gate coupled to the output line 15 of the second stage 200 to receive the sense voltage $V_{SENSE}$. The transistor M9 allows a variable current $I_{XS}$ to conduct. The variable current $I_{XS}$ is dependent upon the sensed voltage $V_{SENSE}$. This supplemental current $I_{XS}$ balances the load current $I_{LOAD}$ so that the sum of the two currents is constant.

The operation of the interface circuit can be understood by an analysis that shows how the load current $I_{LOAD}$ drawn by the internal circuitry through interface output 13 has essentially no effect on the supply current SUPPLY flowing through the power supply pin at interface input 11. We assume, for analysis, perfect matching of the p-channel transistors M3 and M6, of the n-channel transistors M2, M5, and M8, and of the (optional) low-threshold transistors M1, M4, and M7. Slight mismatches from fabrication are permissible. We also assume that the transistors M1 through M8 are saturated. However, for best results, transistor M9 should operate in its linear region and should not saturate unless $I_{LOAD}$ is at or near the minimum effective current demand of the operating internal circuitry drawing power through the interface circuit. We designate the potential in the left branch between the resistor R1 and the p-channel transistor M3 as $V_{OUTREF}$. The corresponding potential in the right branch between the resistor R2 and the p-channel transistor M6 is the potential $V_{OUT}$ on the interface's output line 13. The potential on the interface's power supply input 11 is designated as $V_{IN}$. We designate the potential on the gates of transistors M1, M2, M4, M5, M7, and M8 as $V_{DC1}$, and the potential on the gates of transistors M3 and M6 as $V_{DC2}$.

The supply current $I_{SUPPLY}$ provided on the interface's input line 11 divides into $I_1$, $I_2$, $I_{XS}$, and $I_{LOAD}$ (and also $I_{REF}$ if the current source 20 draws power from the same power supply pin) as the current path branches. However, $I_1$, $I_2$ (and $I_{REF}$) are constant, so any variation in the supply current $I_{SUPPLY}$ depends on $I_{XS}$ and $I_{LOAD}$. The common connection of the gates of the matched transistors M1, M2, M4, M5, M7, and M8 at potential $V_{DC1}$ means that the currents $I_1$ and $I_2$ through the left and right branches of the voltage sensor stage 200 mirror the reference current $I_{REF}$ established by the reference current stage 100. That is, $I_1=I_2=I_{REF}$.

Since the p-channel transistors M3 and M6 are matched and have their gates connected to a common potential $V_{DC2}$, and since $I_1=I_2$ in the two branches, negative feedback in the circuit will ensure that $V_{OUT} \approx V_{OUTREF}$. For if $V_{OUT}$ were to rise above $V_{OUTREF}$, the source-gate voltage of transistor M6 would exceed that of transistor M3. $V_{SENSE}$ will then rise with respect to $V_{DC2}$, which will increase $I_{XS}$ conducted through transistor M9, which in turn will reduce $V_{OUT}$, thereby maintaining it substantially equal to $V_{OUTREF}$. Likewise, if $V_{OUT}$ were to fall below $V_{OUTREF}$, the source-gate voltage of transistor M3 would exceed that of transistor M6. Then, $V_{SENSE}$ will fall with respect to $V_{DC2}$, which will reduce $I_{XS}$ and in turn increase $V_{OUT}$ until it again substantially equals $V_{OUTREF}$.

The supply current $I_{SUPPLY}$ divides into the left and right branches of the voltage sensor:

$$I_{SUPPLY}=I_1+(V_{IN}-V_{OUT})/R_2,$$

where $R_2$ is the interface's output impedance provided by resistor R2. Since $V_{OUT} \approx V_{OUTREF}$, $$I_{SUPPLY} \approx I_1+(V_{IN}-V_{OUTREF})/R_2.$$

Applying Kirchoff's voltage law to the left branch of the voltage sensor:

$$V_{OUTREF}=V_{IN}-(I_1 \times R_1), \text{ and thus}$$

$$I_{SUPPLY} \approx I_1+(I_1 \times R_1)/R_2$$

$$\approx I_1 \times (1+R_1/R_2).$$

Since $I_1=I_{REF}$, we obtain the result:

$$I_{SUPPLY} \approx I_{REF} \times (1+R_1/R_2).$$

Thus, neglecting channel-length modulation and other second-order effects, for which the low-threshold transistors M1, M4, and M7 help to compensate, supply current is independent of the load current $I_{LOAD}$. This is true as long as: (a) we choose the reference current $I_{REF}$ and the ratio of the resistances of R1 and R2, so that the right half of the equation equals or exceeds the maximum load current $I_{LOAD}$ drawn by the internal circuitry through this interface, and (b) we use a supplemental load transistor M9 that is large enough to sink the requisite current $I_{XS}$ without saturating.

For example, if we choose $I_{REF}=8$ $\mu$A and an impedance ratio $R_1/R_2=49$, then $I_{SUPPLY}=400$ $\mu$A, of which 16 $\mu$A will be used for $I_1$ and $I_2$ in the voltage sensor, and the remaining current will be available to the internal circuitry. Any unused supply current will be sunk to ground through the supplemental load transistor M9. Alternatively, if we need a supply current of 1 mA, a reference current of 50 $\mu$A could be used with a ratio $R_1/R_2=19$. Alternatively, a smaller reference current of say 20 $\mu$A could be used with a larger impedance ratio $R_1/R_2=49$, leaving more of the supply current available for the internal circuitry. The example of a 1 mA supply assumes an integrated transistor M9 that can sink the unused current without saturating. However, even if the supplemental load transistor M9 can only sink some of the unused current, and thereby allows current variation to sometimes appear at the chip's power supply pin, it will still have removed a large enough portion of the data-dependence to likely thwart power analysis attacks upon the secured internal data.

The interface circuit of the present invention has a relatively small number of circuit elements, so that it has a small physical size on the chip and is inexpensive to incorporate. The performance is not substantially graded by power supply voltage changes seen on the input side of the interface, since the sensing relies on current mirroring that is substantially independent of input voltage. The interface circuit can be designed by the appropriate selection of a reference current and impedance ratio $R_1/R_2$, to consume only the minimum amount of extra power necessary to compensate for changes in internal load. Likewise, die-to-die process variations in the established supply current can be controlled within acceptable limits, and generally only affect total current usage, not the internal load isolation function provided by the interface. The circuit responds quickly to load changes, since the current demand is both sensed and changes compensated on the output side of the interface with a feedback arrangement directly involving only two transistors M6 and M9. The low output impedance from resistor R2 means that voltage drop from the power supply pin at interface input 11 to the interface output 13 leading to the internal circuitry is relatively small.

What is claimed is:

1. An interface circuit for use between a power supply pin and internal circuitry with a variable load, the interface circuit providing a substantially load-independent current demand at the power supply pin, the interface circuit comprising:
    sensing means, coupled between the power supply pin at an interface input and the internal circuitry at an interface output, for sensing a current load of the internal circuitry and producing a control voltage corresponding to said current load; and
    current sinking means, responsive to said control voltage, for sinking extra current in inverse relation to said current load of the internal circuitry, such that total current demand by both the internal circuitry and the extra current sinking means is at least substantially constant up to saturation of said current sinking means.

2. The interface circuit as in claim 1, further comprising means for establishing a constant reference current for use by said load sensing means.

3. The interface circuit as in claim 2, wherein said reference current means and said load sensing means both have current mirror devices with the gates of the current mirror devices coupled together such that a constant current corresponding to said reference current is established through a current path in said load sensing means.

4. The interface circuit as in claim 1, wherein said load sensing means comprises first and second branches connected in parallel between the interface input and ground, each branch having a resistor, a sense transistor and a current mirror device, the current mirror devices in the two branches establishing corresponding current flow in the branches through said mirror devices, said sense transistors in the two branches having a common gate connection between the sense transistor and mirror device of the first branch, said resistor in the first branch providing substantially larger resistance than said resistor in the second branch, the interface output being coupled between the resistor and sense transistor of the second branch such that current flow through the resistor in the second branch provides a measure of the current load of the internal circuitry in the form of a voltage drop, the voltage drop being provided as a control voltage that is output between the sense transistor and current mirror device of the second branch.

5. The interface circuit as in claim 1, wherein the means for sinking extra current comprises a transistor connected between the interface output and ground, the transistor having a gate coupled to receive the control voltage from the load sensing means, the transistor operating below saturation in a substantially linear region of an operating characteristic of the transistor.

6. An interface circuit for use between a power supply pin and internal circuitry with a variable load, the interface circuit providing a substantially load-independent current demand at the power supply pin, the interface circuit comprising:
    a reference current stage having a constant current source and a current mirror device in series establishing a constant reference current therethrough;
    a load sensing stage coupled between the power supply pin at an interface input and the internal circuitry at an interface output, the load sensing stage including first and second branches connected in parallel between the interface input and ground, each branch having a resistor, a sense transistor and a current mirror device, the current mirror devices in the two branches and the current mirror device in the reference current stage having the gates of the current mirror devices coupled together to establish current flow through the mirror devices of the two branches which correspond to the constant reference current, the sense transistors of the two branches having a common gate connection between the sense transistor and current mirror device of the first branch, said resistor of the first branch providing substantially larger resistance than said resistor in the second branch, the interface output being coupled between the resistor and sense transistor of the second branch such that current flow through the resistor in the second branch provides a measure of the current load of the internal circuitry in the form of a voltage drop, the voltage drop being provided as a control voltage that is output from the load sensing stage between the sense transistor and current mirror device of the second branch; and
    a supplemental load stage including a transistor connected between the interface output and ground, the transistor having a gate coupled to receive the control voltage output from the load sensing stage, the transistor operating below saturation in a substantially linear region of an operating characteristic of the transistor such that the transistor sinks extra current in inverse relation to the current load of the internal circuitry.

7. A method of providing a substantially load-independent current demand at a power supply pin of an integrated circuit notwithstanding a variable load by internal circuitry of the integrated circuit, the method comprising:
    sensing, by an interface circuit provided between the power supply pin and the internal circuitry, a current load of the internal circuitry and producing a control voltage corresponding to the sensed current load; and
    sinking, by a supplemental load device of the interface circuit responsive to the control voltage, extra current in inverse relation to the current load of the internal circuitry, such that total current demand by both the internal circuitry and the supplemental load device is substantially constant up to a saturation level of the supplemental load device.

8. The method of claim 7, wherein sensing the current load and producing a corresponding control voltage involves providing a voltage drop from an interface input coupled to the power supply pin across an output impedance of the interface circuit that is coupled to the internal circuitry, the voltage drop across the output impedance being referenced against a voltage drop across a proportional resistor for a constant reference current.

9. The method of claim 8, wherein the referencing of the voltage drop is accomplished by a load sensing stage of the interface circuit comprising first and second parallel branches connected between the interface input and ground, each branch having a resistor, a sense transistor and a current mirror device, the current mirror devices establishing corresponding current flow in the branches through said mirror devices, the sense transistors having a common gate connection between the sense transistor and mirror device of the first branch, the resistor in the first branch being the proportional resistor that has a substantially larger resistance than the resistor in the second branch, the resistor in the second branch being the output impedance with the interface output coupled between the resistor and sense transistor of the second branch, and wherein the voltage drop across the output impedance is provided as the control voltage between the sense transistor and current mirror device of the second branch.

10. The method of claim 7, wherein the supplemental load device that sinks the extra current is a transistor connected between an interface output coupled to the internal circuitry and ground, and having a gate coupled to receive the control voltage, the transistor operating below saturation in a substantially linear region of an operating characteristic of the transistor.

11. An integrated circuit comprising:

at least one power supply pin;

internal circuitry drawing current through the power supply pin; and an interface circuit electrically coupled between the power supply pin and the internal circuitry and providing a supplemental current load such that total current demand by both the internal circuitry and interface circuit is substantially constant at the power supply pin notwithstanding any current load variation by the internal circuitry.

12. The integrated circuit as in claim 11, wherein the interface circuit includes means for sensing a current load of said internal circuitry and producing a control voltage corresponding thereto and means responsive to the control voltage for sinking extra current in inverse relation to the sensed current load of the internal circuitry.

* * * * *

UNITED STATES PATENT AND TRADEMARK OFFICE
CERTIFICATE OF CORRECTION

| | |
|---|---|
| PATENT NO. | : 6,963,188 B2 |
| APPLICATION NO. | : 10/818865 |
| DATED | : November 8, 2005 |
| INVENTOR(S) | : Mathew T. Wich |

It is certified that error appears in the above-identified patent and that said Letters Patent is hereby corrected as shown below:

Column 3, lines 48-49  "..., essentially no effect on the supply current SUPPLY flowing through the power supply..." should read:

-- essentially no effect on the supply current $I_{SUPPLY}$ flowing through the power supply...--

Signed and Sealed this

Ninth Day of January, 2007

JON W. DUDAS
*Director of the United States Patent and Trademark Office*